(12) United States Patent
Miyoshi et al.

(10) Patent No.: US 7,727,344 B2
(45) Date of Patent: Jun. 1, 2010

(54) COPPER ALLOY SUITABLE FOR AN IC LEAD PIN FOR A PIN GRID ARRAY PROVIDED ON A PLASTIC SUBSTRATE

(75) Inventors: Takashi Miyoshi, Tokyo (JP); Tsutomu Saito, Tokyo (JP); Isao Takahashi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 33 days.

(21) Appl. No.: 10/361,709

(22) Filed: Feb. 6, 2003

(65) Prior Publication Data

US 2003/0121573 A1 Jul. 3, 2003

Related U.S. Application Data

(63) Continuation of application No. 09/844,155, filed on Apr. 27, 2001, now abandoned.

(30) Foreign Application Priority Data

Apr. 28, 2000 (JP) .............................. 2000-130906

(51) Int. Cl.
  C22F 1/08 (2006.01)
  C22C 9/00 (2006.01)
  C22C 9/10 (2006.01)
(52) U.S. Cl. ..................................... 148/682
(58) Field of Classification Search ................ 148/682
  See application file for complete search history.

(56) References Cited

U.S. PATENT DOCUMENTS

| | | | |
|---|---|---|---|
| 3,522,039 A * | 7/1970 | McLain ....................... 420/477 |
| 4,196,959 A * | 4/1980 | Chesemore et al. ............ 439/65 |
| 4,362,579 A | 12/1982 | Tsuji |
| 4,439,247 A | 3/1984 | Arita et al. |
| 4,668,471 A * | 5/1987 | Futatsuka et al. ............ 420/477 |
| 4,877,577 A | 10/1989 | Futatsuka et al. |
| 5,028,391 A | 7/1991 | Ingerson |
| 5,334,346 A | 8/1994 | Kim et al. |
| 5,463,247 A | 10/1995 | Futatsuka et al. |

FOREIGN PATENT DOCUMENTS

| | | | |
|---|---|---|---|
| JP | 55034614 | * | 3/1980 |
| JP | 59-193233 | | 11/1984 |
| JP | 61076636 | * | 4/1986 |
| JP | 61-127842 | | 6/1986 |
| JP | 62-093325 | | 4/1987 |
| JP | 62180025 | * | 8/1987 |
| JP | 63-130739 | | 6/1988 |
| JP | 1-198439 A | | 8/1989 |
| JP | 2-118037 | | 5/1990 |
| JP | 2-170937 | | 7/1990 |
| JP | 05-059468 | | 3/1993 |
| JP | 05-311291 | | 11/1993 |
| JP | 06-100983 | | 4/1994 |
| JP | 07-054079 | | 2/1995 |
| JP | 7-090520 | | 4/1995 |
| JP | 10-330867 | | 12/1998 |
| JP | 11-043731 | | 2/1999 |
| JP | 11-80862 A | | 3/1999 |
| JP | 01-180932 | | 7/1999 |
| JP | 11222641 | | 8/1999 |
| JP | 11-256256 | | 9/1999 |

* cited by examiner

*Primary Examiner*—Sikyin Ip
(74) *Attorney, Agent, or Firm*—Birch, Stewart, Kolasch & Birch, LLP

(57) ABSTRACT

A copper alloy suitable for an IC lead pin for a pin grid array provided on a plastic substrate, which copper alloy is a Cu—Zn—Mg alloy, a Cu—Sn alloy, a Cu—SN—Ag alloy, a Cu—Fe—Zn—P alloy, or a Cu—Cr alloy, each having a given alloy composition, in which the copper alloy has conductivity of 50% IACS or more and tensile stress of 400 MPa to 650 MPa.

4 Claims, No Drawings

COPPER ALLOY SUITABLE FOR AN IC LEAD PIN FOR A PIN GRID ARRAY PROVIDED ON A PLASTIC SUBSTRATE

This application is a continuation of U.S. application Ser. No. 09/844,155 filed Apr. 27, 2001, now abandoned.

FIELD OF THE INVENTION

The present invention relates to a copper alloy suitable for materials of an IC lead pin for a pin grid array (hereinafter, simply referred to as an IC lead pin for PGA) provided on a plastic substrate.

BACKGROUND

An IC lead pin for PGA is provided by blazing, to be an electric input/output terminal on a back surface of a substrate having a semiconductor element mounted thereon. As the substrate, use has been made of a ceramics material. For the IC lead pin for PGA, mainly use has been made of Kovar (an Fe—Ni—Co alloy) that has a low thermal expansion coefficient equal to that of the ceramics substrate and that is excellent in tensile stress and repeated bending property.

In recent years, there has been a tendency to use a plastic substrate as the above substrate. In the case of such a plastic substrate, there is no need to employ a material with a low thermal expansion coefficient for an IC lead pin for PGA.

On the other hand, in order to improve function of IC, it is desired to ensure speedy transmission in a CPU (central processing unit) and provide a highly dense IC, and a material with high conductivity is required for an IC lead pin for PGA.

SUMMARY

The present invention is a copper alloy suitable for an IC lead pin for a pin grid array provided on a plastic substrate, which copper alloy is one alloy selected from the group consisting of:
  a copper alloy containing 0.05 to 0.5 wt % of Zn and 0.05 to 0.5 wt % of Mg, with the balance being made of unavoidable impurities and Cu;
  a copper alloy containing 0.1 to 1.0 wt % of Sn, with the balance being made of unavoidable impurities and Cu;
  a copper alloy containing 0.1 to 1.0 wt % of Sn and 0.1 to 0.6 wt % of Ag, with the balance being made of unavoidable impurities and Cu;
  a copper alloy containing 2.1 to 2.6 wt % of Fe, 0.05 to 0.2 wt % of Zn, and 0.015 to 0.15 wt % of P, with the balance being made of unavoidable impurities and Cu; and
  a copper alloy containing 0.4 to 1.1 wt % of Cr, with the balance being made of unavoidable impurities and Cu,
  wherein the copper alloy has conductivity of 50% IACS or more and tensile stress of 400 MPa or more but 650 MPa or less.

Other and further features and advantages of the invention will appear more fully from the following description.

DETAILED DESCRIPTION

The inventors conducted research to find an IC lead pin for PGA provided on a plastic substrate, with the lead pin being capable of coping with speedy CPU transmission and providing a highly dense IC. As a result, we found that the characteristics required therefor are conductivity of 50% IACS or more, tensile stress equal to Kovar, and high repeated bending property. We conducted further research to complete the present invention.

The copper alloy of the present invention is a copper alloy suitable for an IC lead pin for a grid array provided on a plastic substrate, with the copper alloy being any one of five kinds of copper alloys, i.e., a Cu—Zn—Mg alloy, a Cu—Sn alloy, a Cu—Sn—Ag alloy, a Cu—Fe—Zn—P alloy, and a Cu—Cr alloy, wherein the quantities of each alloy elements are properly defined, thereby the copper alloy being provided conductivity of 50% IACS or more, tensile stress of 400 MPa or more but 650 MPa or less, and practically-allowable level of repeated bending property can be given.

In the present invention, the conductivity is set to 50% IACS or more, because the conductivity of less than 50% IACS cannot cope with speedy CPU transmission or provide a highly dense IC satisfactorily. In addition, the tensile stress is set to 400 MPa or more but 650 MPa or less, because tensile stress of less than 400 MPa may damage a pin during IC assembling and using, and sufficient repeated bending property may not be obtained if the tensile stress exceeds 650 MPa.

Alloy elements and compositions of the five kinds of copper alloys for use in the present invention will be described below.

In the above Cu—Zn—Mg alloy, alloy elements Zn and Mg contribute to improve mechanical strength. In this copper alloy, the contents of Zn and Mg are 0.05 to 0.5 wt %, respectively. This is because sufficient tensile stress cannot be obtained if either one of the contents is less than the lower limit, and sufficient conductivity or repeated bending property cannot be obtained if either one of the contents exceeds the upper limit.

In the Cu—Sn alloy, an alloy element, Sn, contributes to improve mechanical strength. In this copper alloy, the content of Sn is defined within the range of 0.1 to 1.0 wt %. This is because sufficient tensile stress cannot be obtained if the content is less than 0.1 wt %, and sufficient conductivity or repeated bending property cannot be obtained if the content is more than 1.0 wt %.

In the Cu—Sn—Ag alloy, Sn and Ag contribute to improve mechanical strength. In this copper alloy, the Sn content is defined within the range of 0.1 to 1.0 wt %, and the Ag content is defined within the range of 0.1 to 0.6 wt %. This is because sufficient tensile stress cannot be obtained if either one of the contents is less than the lower limit, and sufficient conductivity or repeated bending property cannot be obtained if either one of the contents exceeds the upper limit. Further, Ag in a too high content is disadvantageous to cost efficiency because Ag is expensive.

In the Cu—Fe—Zn—P alloy, Fe, Zn and P contribute to improve mechanical strength. In this copper alloy, the Fe content is defined within the range of 2.1 to 2.6 wt %, the Zn content is defined within the range of 0.05 to 0.2 wt %, and the P content is defined within the range of 0.015 to 0.15 wt %, respectively. This is because sufficient tensile stress cannot be obtained if any one of these contents is less than the lower limit, and sufficient conductivity or repeated bending property cannot be obtained if any one of the contents exceeds the upper limit.

In the Cu—Cr alloy, Cr contributes to improve mechanical strength. In this copper alloy, the Cr content is defined within the range of 0.4 to 1.1 wt %. This is because sufficient tensile stress cannot be obtained if the content is less than 0.4 wt %, and sufficient conductivity or repeated bending property cannot be obtained if the content exceeds 1.1 wt %.

The copper alloy of the present invention can be manufactured in a usual manner, for example, by applying melt-casting, hot-working (such as extrusion or rolling), and drawing (including wire-drawing) all of the preceding, one after another, in this order. Although the characteristics such as conductivity or tensile stress, are mainly determined depending on alloy composition, they can be adjusted by selecting heat treatment conditions, such as intermediate annealing applied in mid course of drawing.

Preferable conditions in each of the above steps are as follows. The melt-casting is preferably carried out at a temperature of 1,100 to 1,300° C. The hot-working, such as extrusion, is preferably carried out at a temperature of 700 to 900° C. for 2 to 4 hours. The intermediate annealing is preferably carried out at a temperature of 400 to 600° C. for 2 to 4 hours.

The copper alloy of the present invention has conductivity that can adequately cope with speedy CPU transmission or provide a highly dense IC, it has tensile stress equal to conventional Kovar, and it has practically-sufficient level of high repeated bending property. Accordingly, the copper alloy of the present invention is preferable for an IC lead pin for PGA provided on a plastic substrate. Therefore, the present invention exhibits a significant advantageous effect from the industrial viewpoint.

The present invention will be described in more detail by way of the following examples, but the invention is not limited to these.

EXAMPLES

Example 1

A Cu—Zn—Mg alloy, a Cu—Sn alloy, a Cu—Sn—Ag alloy, a Cu—Fe—Zn—P alloy, and a Cu—Cr alloy, with their compositions defined in the present invention, were melt-casted in a usual manner, to make a cast ingot, respectively. Each cast ingot was subjected to hot extrusion and then drawing, in this order. Then, wire drawing was carried out, and in mid course thereof an intermediate annealing was carried out, to produce a rod of 0.4 mm in diameter, respectively. The conditions in the above steps were as follows. The melt-casting was carried out at a temperature of 1,100 to 1,300° C. The extrusion was carried out at a temperature of 700 to 900° C. for 2 to 4 hours. The intermediate annealing was carried out at a temperature of 400 to 600° C. for 2 to 4 hours.

Comparative Example 1

A rod of 0.4 mm in diameter was produced in the same manner as in Example 1 except that the composition of each copper alloy was set to be outside the definition in the present invention.

The tensile stress, conductivity, and repeated bending property were examined with respect to each of the rods manufactured in Example 1 and Comparative Example 1. Further, the adhesion of Au plating applied to an IC lead pin for PGA was also examined.

The tensile stress was measured by carrying out a test according to JIS Z 2241, using a test piece produced from each rod according to JIS Z 2201.

The conductivity was measured by carrying out a test according to JIS H 0505, using a test piece produced from each rod according to JIS H 0505.

The repeated bending property was evaluated by counting the number of bending operations, in which a weight of 230 g was suspended at one end of the rod, and 90-degree bending operation was carried out in the right and left (horizontal) direction until breakage occurred. The number of bending operations was counted, with one reciprocation defined as one count. If the number of bending operations is 6 or more, there is no practical problem. Thus, a number of 6 or more bending operations was judged to be good (allowable).

The adhesion of Au plating was examined by applying plating of Au to each rod in a usual manner, and twist-testing each rod with Au plating. The twisting test was carried out under conditions in which after 50 rotations in one rotation direction, were done 40 rotations in the inverse direction, with a distance of 50 mm between chucks. The presence or absence of pealing of Au plating was judged by observation with the naked eye.

The results are shown in Table 1.

TABLE 1

| Classification | No. | Alloy | Alloy composition wt % | | | | | | | Tensile stress (Mpa) | Conductivity (% IACS) | Repeated bending property (Number) | Adhesion of Au plating |
| --- | --- | --- | --- | --- | --- | --- | --- | --- | --- | --- | --- | --- | --- |
| | | | Zn | Mg | Sn | Ag | Fe | P | Cr | | | | |
| Examples according of this invention | 1 | Cu—Zn—Mg | 0.1 | 0.2 | — | — | — | — | — | 540 | 75 | 8 | Good |
| | 2 | | 0.3 | 0.5 | — | — | — | — | — | 570 | 66 | 7 | Good |
| | 3 | Cu—Sn | — | — | 0.7 | — | — | — | — | 580 | 62 | 7 | Good |
| | 4 | | — | — | 1.0 | — | — | — | — | 620 | 52 | 6 | Good |
| | 5 | Cu—Sn—Ag | — | — | 0.6 | 0.3 | — | — | — | 560 | 59 | 7 | Good |
| | 6 | | — | — | 1.0 | 0.3 | — | — | — | 640 | 50 | 6 | Good |
| | 7 | Cu—Zn—Fe—P | 0.1 | — | — | — | 2.1 | 0.1 | — | 440 | 68 | 13 | Good |
| | 8 | | 0.1 | — | — | — | 2.5 | 0.1 | — | 480 | 64 | 10 | Good |
| | 9 | | 0.2 | — | — | — | 2.1 | 0.1 | — | 460 | 66 | 12 | Good |
| | 10 | | 0.2 | — | — | — | 0.5 | 0.1 | — | 500 | 62 | 9 | Good |
| | 11 | Cu—Cr | — | — | — | — | — | — | 0.5 | 500 | 91 | 8 | Good |
| | 12 | | — | — | — | — | — | — | 0.1 | 550 | 85 | 7 | Good |
| Comparative Examples | 13 | Cu—Zn—Mg | 0.02 | 0.04 | — | — | — | — | — | 370 | 88 | 9 | Good |
| | 14 | | 0.8 | 0.6 | — | — | — | — | — | 650 | 28 | 3 | Good |
| | 15 | Cu—Sn | — | — | 0.05 | — | — | — | — | 340 | 95 | 14 | Good |
| | 16 | | — | — | 2.0 | — | — | — | — | 670 | 28 | 3 | Good |
| | 17 | Cu—Sn—Ag | — | — | 0.05 | 0.05 | — | — | — | 360 | 75 | 9 | Good |
| | 18 | | — | — | 2.0 | 1.0 | — | — | — | 680 | 30 | 3 | Good |
| | 19 | Cu—Zn—Fe—P | 0.03 | — | — | — | 1.8 | 0.1 | — | 360 | 70 | 13 | Good |
| | 20 | | 0.3 | — | — | — | 3.0 | 0.1 | — | 520 | 42 | 2 | Good |
| | 21 | Cu—Cr | — | — | — | — | — | — | 0.2 | 330 | 94 | 9 | Good |
| | 22 | | — | — | — | — | — | — | 1.3 | 600 | 70 | 2 | Good |

TABLE 1-continued

| Classi-fication | No. | Alloy | Alloy composition wt % | | | | | | | Tensile stress (Mpa) | Conductivity (% IACS) | Repeated bending property (Number) | Adhesion of Au plating |
|---|---|---|---|---|---|---|---|---|---|---|---|---|---|
| | | | Zn | Mg | Sn | Ag | Fe | P | Cr | | | | |
| Conventional Example | 23 | Kovar (Fe-29 wt % Ni-17 wt % Co) | | | | | | | | 580 | 20 | 78 | Good |

As is apparent from Table 1, No. 1 to No. 12 of Examples according to the present invention each had 50% IACS or more in conductivity and 400 MPa or more but 650 MPa or less in tensile stress. Further, the repeated bending property and the adhesion of Au plating were good. These indicated to have excellent characteristics as required for an IC lead pin for PGA provided on a plastic substrate.

On the other hand, in Comparative Examples, No. 13 had too small contents of Zn and Mg, No. 15 had a too small content of Sn, No. 17 had too small contents of Sn and Ag, No. 19 had too small contents of Fe and Zn, and No. 21 had a too small content of Cr, and thus, they each were quite low in tensile stress. Further, No. 14 had too large contents of Zn and Mg, No. 16 had a too large content of Sn, No. 18 had too large contents of Sn and Ag, No. 20 had too large contents of Fe and Zn, and No. 22 had a too large content of Cr, and thus, they each were poor in repeated bending property. In addition, the alloys in Nos. 14, 16, 18 and 20 were also poor in conductivity. These mean that all the alloys in the Comparative Examples were improper for an IC lead pin for PGAs.

The rod manufactured in Example 1 according to the present invention was subject to heading to form an IC lead pin for PGA, and a high-speed, high-density IC was assembled using the resultant IC lead pin. The resultant IC operated properly, and the IC lead pin for PGA was neither bent nor broken when assembling. This is because the IC lead pin for PGA had high conductivity and excellent tensile stress and repeated bending property.

Having described our invention as related to the present embodiments, it is our intention that the invention not be limited by any of the details of the description, unless otherwise specified, but rather be construed broadly within its spirit and scope as set out in the accompanying claims.

What is claimed is:

1. A method of making a wire comprising the steps of:
    melt casting a copper alloy at 1100° C. to 1300° C., wherein said alloy consists essentially of 2.1 to 2.6 wt. % of Fe, 0.05 to 0.2 wt. % of Zn, and 0.015 to 0.15 wt. % of P, with the balance being made of unavoidable impurities and Cu;
    extruding the alloy at 700° C. to 900° C. for 2-4 hours; and
    drawing the alloy to form the alloy having a round cross section, wherein intermediate annealing of the alloy is carried out at 400° C. to 600° C. in mid course of the drawing,
    wherein resulting copper alloy after said drawing step having said round cross section has:
        (a) a conductivity of 62% to 68% IACS,
        (b) a tensile stress of 440 MPa to 500 MPa, and
        (c) a repeated bending property of 9 to 13, wherein the repeated bending property is evaluated in a repeated bending property evaluation in which a weight of 230 g is suspended at one end of a rod of 0.4 mm in diameter, and a 90 degree bending operation is carried out in the right and left direction until breakage occurs.

2. The method of making a wire according to claim 1, wherein said alloy consists essentially of 2.1 to 2.5 wt. % of Fe, 0.1 to 0.2 wt. % of Zn, and 0.1 wt. % of P, with the balance being made of unavoidable impurities and Cu.

3. A method of making a wire having a round cross section for an IC lead pin in a pin grid array comprising:
    melt casting a copper alloy at 1100° C. to 1300° C., wherein said alloy consists of 2.1 to 2.6 wt. % of Fe, 0.05 to 0.2 wt. % of Zn, and 0.015 to 0.15 wt. % of P, with the balance being made of unavoidable impurities and Cu;
    extruding the alloy at 700° C. to 900° C. for 2-4 hours; and
    drawing the alloy to form the alloy having a round cross section, wherein intermediate annealing of the alloy is carried out at 400° C. to 600° C. in mid course of the drawing,
    wherein resulting copper alloy after said drawing step having said round cross section has:
        (a) a conductivity of 62% to 68% IACS,
        (b) a tensile stress of 440 MPa to 500 MPa, and
        (c) a repeated bending property of 9 to 13, wherein the repeated bending property is evaluated in a repeated bending property evaluation in which a weight of 230 g is suspended at one end of a rod of 0.4 mm in diameter, and a 90 degree bending operation is carried out in the right and left direction until breakage occurs.

4. The method of making a wire according to claim 3, wherein said alloy consists of 2.1 to 2.5 wt. % of Fe, 0.1 to 0.2 wt. % of Zn, and 0.1 wt. % of P, with the balance being made of unavoidable impurities and Cu.

* * * * *